United States Patent [19]

Sezi et al.

[11] Patent Number: 5,750,638
[45] Date of Patent: May 12, 1998

[54] METHOD FOR THE PRODUCTION OF POLY-O-HYDROXYAMIDES

[75] Inventors: Recai Sezi; Hellmut Ahne, both of Roettenbach; Roland Gestigkeit, Nuremberg, all of Germany

[73] Assignee: Siemens Aktiengesesllschaft, Munich, Germany

[21] Appl. No.: 666,177

[22] Filed: Jun. 19, 1996

[30] Foreign Application Priority Data

Jun. 19, 1995 [DE] Germany ............ 195 22 158.3

[51] Int. Cl.$^6$ ............ C08G 69/08; C08G 73/10
[52] U.S. Cl. ............ 528/310; 528/170; 528/176; 528/182; 528/184; 528/204; 528/208; 528/312; 528/314; 528/322; 528/332; 528/336; 528/377
[58] Field of Search ............ 528/310, 322, 528/312, 314, 377, 184, 182, 170, 176, 207, 208, 336, 332

[56] References Cited

U.S. PATENT DOCUMENTS

| | | | |
|---|---|---|---|
| 3,637,601 | 1/1972 | Truce et al. | 260/78 R |
| 4,331,592 | 5/1982 | Wissmann et al. | 260/112.5 |
| 4,339,521 | 7/1982 | Ahne et al. | 430/192 |
| 4,395,482 | 7/1983 | Ahne et al. | 430/326 |
| 4,622,285 | 11/1986 | Ahne | 430/322 |
| 4,849,051 | 7/1989 | Ahne et al. | 156/659.1 |
| 5,021,320 | 6/1991 | Mueller et al. | 430/192 |
| 5,077,378 | 12/1991 | Mueller et al. | 528/185 |
| 5,096,999 | 3/1992 | Hellmut et al. | 528/182 |
| 5,147,961 | 9/1992 | Ahne et al. | 528/182 |
| 5,194,568 | 3/1993 | Gregory et al. | 528/184 |
| 5,219,981 | 6/1993 | Gregory et al. | 528/377 |

FOREIGN PATENT DOCUMENTS

| | | |
|---|---|---|
| 0 023 662 | 5/1983 | European Pat. Off. . |
| 0 158 726 | 10/1985 | European Pat. Off. . |
| 0 264 678 | 5/1988 | European Pat. Off. . |
| 0 391 196 | 10/1990 | European Pat. Off. . |
| 0 481 402 | 4/1992 | European Pat. Off. . |
| 0 291 779 | 7/1994 | European Pat. Off. . |
| 3 716 629 | 12/1988 | Germany . |
| 2188936 | 10/1987 | United Kingdom . |

OTHER PUBLICATIONS

Labadie, J. et al., "Recent Advances in High Temperature Polymers For Microelectronic Applications," *Sampe Journal*, vol. 25, No. 6, Nov./Dec. 1989.

Soane, D. et al., "Resists in Microlithography," *Polymers in Microelectronics Fundamentals* and Applications, Amsterdam Oxford-New York-Tokyo (1989), pp. 77-124.

Proceedings of the 1992 International Conference on Multichip Modules, Apr. 1-3, 1992 Radisson Hotel Denver, pp. 394-400.

Mercer, F., "Aromatic Poly (ether imide oxadiazole)s," *High Performance Ploymers*, vol. 4, No. 2 (1992), pp. 73-80.

Ahne, H. et al., "Recent Advances in Photosensitive Polyimides," *Polymers for Advanced Technologies*, vol. 4, pp. 217-233.

*Primary Examiner*—P. Hampton-Hightower
*Attorney, Agent, or Firm*—Kenyon & Kenyon

[57] ABSTRACT

A method for producing poly-o-hydroxy amides by heating a dicarboxylic acid to a temperature $\geq 80°$ C., together with a sulfonic acid chloride and a tertiary amine in a suitable solvent, to form a reaction mixture and reacting the mixture obtained with a bis-o-aminophenol solution at a temperature $<80°$ C.

8 Claims, No Drawings

METHOD FOR THE PRODUCTION OF POLY-O-HYDROXYAMIDES

BACKGROUND OF THE INVENTION

1. Field of the Invention

The invention relates to a method for the production of poly-o-hydroxyamides by conversion of a dicarboxylic acid with a bis-o-aminophenol.

2. Description of Related Art

In microelectronics, highly heat-resistant polymers are required, particularly as protective and insulating layers, or as dielectrics (see, for example: "SAMPE Journal," Vol. 25 (1989), No. 6, pages 18 to 23, and "Proceedings of the 1992 International Conference on Multichip Modules," pages 394 to 400). Some of the polymers used, for example homopolymers and copolymers of aromatic polyethers as well as precursors of polyimides (PI) and polybenzoxazoles (PBO), demonstrate good solubility in organic solvents and good film formation properties, and can be applied to electronic components by means of spincoating (see, for example, "High Performance Polymers," Vol. 4 (1992), No. 2, pages 73 to 80, and "Polymers for Advanced Technologies," Vol. 4 (1993), pages 217 to 233). Polymer precursors of the type stated are cyclized, i.e., converted to the corresponding polymers (PI and PBO, respectively), by temperature treatment; thereby the final properties are obtained.

PI and PBO precursors can also be made photosensitive, for example by adding suitable photoactive components, and thereby structured directly, i.e., without using an auxiliary resist. When using alkali-soluble precursors, photosensitive PBO precursors—as compared to most photosensitive PI precursors—result in the advantage of structurability in the positive mode and the possibility of aqueous-alkaline development (see EP-PS 0 023 662, EP-OS 0 264 678 and EP-PS 0 291 779). Except for the cyclization step, the photolithographic process is the same process that is used to structure prior art positive resists based on novolaks and quinonazides, a process used worldwide in numerous production lines (see for example, D. S. Soane and Z. Martynenko "Polymers in Microelectronics—Fundamentals and Applications," Elsevier, Amsterdam 1989, pages 77 to 124).

The most common method for the production of alkali-soluble PBO precursors, i.e., of poly-o-hydroxyamides, is the conversion of a dicarboxylic acid chloride with a suitable bis-o-aminophenol. To capture the hydrochloride which is formed during the reaction, a soluble base, such as pyridine, is generally added (see EP-PS 0 264 678 and EP-PS 0 291 779). Good solubility in alkali is an important property for PBO precursors that are to be used as the base polymer for a photosensitive dielectric which can be developed using an aqueous-alkaline method. For microelectronic applications, the precursors must be soluble in developers free of metal ions so that such developers can also be used in photostructuring.

A great disadvantage of production methods that use dicarboxylic acid chlorides is the fact that these acid chlorides must be produced from their corresponding acids in a separate process. This is because the acid chlorides of a majority of dicarboxylic acids are not commercially available. The additional synthesis of a dicarboxylic acid chloride necessitates significant additional costs. This is generally true for other activated dicarboxylic acid derivatives as well, for example esters.

For the synthesis of poly-o-hydroxyamides, it is also known to convert the bis-o-aminophenol with the dicarboxylic acid in the presence of a carbodimide (EP-OS 0 158 726). In this reaction, however, residues of urea, which remain on the resin on the basis of a relocation reaction, often present problems. This is because they impair the thermal resistance of the polybenzoxazol as well as the quality of the layers produced from it.

An alternative production method for poly-o-hydroxyamides consists of carrying out the conversion of the dicarboxylic acid with the bis-o-aminophenol using a condensation reagent, such as 1-ethoxy carbonyl-2-ethoxy1, 2-dihydroquinoline or 1,1'-carbonyl dioxy-di-1,2,3-benzotriazole (see: EP-OS 0 391 196). However, the polymers produced in this manner are not sufficiently soluble in aqueous-alkaline developers, especially in developers which are free of metal ions.

Methods are also known where the amide formation is carried out with phosphorus compounds (see EP-OS 0 481 402, U.S. Pat. No. 4,331,592 and DE-OS 37 16 629). In the case of poly-o-hydroxyamides, however, such synthesis methods either lead directly to cyclized products, i.e., products insoluble in alkali, or residues containing phosphorus (some of them chemically bound) remain in the polymer. The presence of phosphorus in the polymer makes it unusable for microelectronic applications due to the doping properties of phosphorus. In contrast to ionic contaminants, such residues cannot be removed by means of ion exchangers.

There is, therefore, no universal method for the production of poly-o-hydroxyamides soluble in alkali in which dicarboxylic acids can be used directly instead of dicarboxylic acid chlorides or other active dicarboxylic acid derivatives. Such a method must also fulfill the requirement that the carboxyl groups of the dicarboxylic acid react with the amino groups of the bis-o-aminophenol (forming amides), but not with its hydroxyl groups (forming esters), which are necessary for the poly-o-hydroxyamide to be soluble in alkali, i.e., the reaction selectivity for amide formation must be greater than its ability to form esters. If ester formation cannot be precluded or sufficiently suppressed, it causes a deterioration in the solubility in alkali and in the cyclization behavior of the poly-o-hydroxyamide produced. Furthermore, a low reaction selectivity can result in gel formation in the polymer solution, which makes the poly-o-hydroxyamide unusable.

SUMMARY OF THE INVENTION

It is an object of the present invention to produce poly-o-hydroxyamides that are soluble in alkali using a simple and cost-effective method.

It is a further object of the invention to produce poly-o-hydroxyamides from a dicarboxylic acid and a bis-o-aminophenol without the additional production of an active dicarboxylic acid derivative.

It is another object of the present invention to produce poly-o-hydroxyamides without residues of urea or the presence of phosphorus in the polymer.

It is yet another object of the invention to produce poly-o-hydroxyamides without causing gel formation in the polymer solution.

These objects are achieved, according to the invention, by (a) heating a dicarboxylic acid to a temperature $\geq 80°$ C., together with a sulfonic acid chloride and a tertiary amine, in a suitable solvent, and (b) reacting the mixture thus obtained with a solution of bis-o-aminophenol, at a temperature $<80°$ C.

DETAILED DESCRIPTION OF THE INVENTION

The invention solves the problem described above by means of a simplified method, namely a one-pot method. In this method, first the dicarboxylic acid is heated to a temperature of at least 80° C. and preferably to a temperature of ≧110° C., with a sulfonic acid chloride and a base, in a suitable solvent, preferably for a period of 30 to 120 minutes. The mixture is then reacted with a solution of the bis-o-aminophenol, at a temperature below 80° C., preferably a temperature of 0° to 30° C. This method is highly selective for amide formation as compared with ester formation. For good selectivity, it is important that the work is carried out first at high temperatures (Process Step a) and then at low temperatures (Process Step b). In Process Step b, it is inconsequential whether the bis-o-aminophenol solution is added to that of the dicarboxylic acid or vice versa.

The sulfonic acid chloride is preferably a toluene sulfonic acid chloride, and most preferably p-toluene sulfonic acid chloride. However, other sulfonic chlorides can also be used, specifically aromatic or aliphatic sulfonic acid chlorides such as benzene sulfonic acid chloride and methane sulfonic acid chloride. The tertiary amine, i.e., the base, is preferably pyridine or triethylamine. Other possible bases are heterocyclic tertiary nitrogen compounds, such as quinoline, and aliphatic tertiary amines, such as methyl diethyl amine, as well as aliphatic-aromatic tertiary amines, such as N,N-dimethyl aniline. As the solvent, both for the dicarboxylic acid and for the bis-o-aminophenol, i.e., for both process steps, preferably N-methyl pyrrolidone or N,N-dimethyl acetamide is used. In addition, γ-butyrolactone can also be used, for example.

In the method according to the invention, the dicarboxylic acid and the bis-o-aminophenol can be used in a molar ratio of about 1:1. If an excess of bis-o-aminophenol is used, then the amino end groups of the poly-o-hydroxyamide produced can be capped, i.e., blocked with a dicarboxylic acid anhydride. cis-5-norbornene-endo-2,3-dicarboxylic acid anhydride is particularly suitable for this.

From U.S. Pat. No. 3,637,601, a method for the production of polyamides and polyesters which contain sulfur is known; this method is intended to improve the dyeing capacity of the polyamides and polyesters. However, this method is not suitable for the production of poly-o-hydroxyamides soluble in alkali, as the comparison tests described below show. In addition, polymers which contain sulfur, in contrast to the polymers according to the invention which do not contain sulfur, are unsuitable as coatings in microelectronics because they can cause corrosion. Sulfur-containing polymers also cause contact deposits in reducing media, as occur in semiconductor production, and thereby impair the reliability of the electrical contacts.

The following examples are provided to further illustrate the invention. The examples are intended to be illustrative in nature and are not to be construed as limiting the scope of the invention.

EXAMPLE 1

A solution of 7.54 g p-toluene sulfonic acid chloride and 7.05 g pyridine in 70 mL N-methyl pyrrolidone is added to a solution of 4.65 g diphenyl ether,-4,4'-dicarboxylic acid in 40 mL N-methyl pyrrolidone while stirring. The resulting mixture is stirred at room temperature (approximately 21°–4° C.) for 30 minutes, and subsequently heated to a temperature of about 120° C. for 30 minutes. Afterwards, the mixture is allowed to cool to room temperature while being stirred. A solution which was produced by dissolving 7.33 g hexafluoro-2,2-bis-(4-hydroxy3-aminophenyl) propane in 90 mL N-methyl pyrrolidone at room temperature while stirring, is dripped into the reaction mixture obtained, at room temperature, while stirring. The resulting reaction mixture is allowed to finish reacting at room temperature for 20 hours. Subsequently, the end groups are blocked, for which purpose a solution of 1.48 g cis-5norbornene-endo-2,3-dicarboxylic acid anhydride in 10 mL N-methyl pyrrolidone is dripped into the reaction solution at room temperature, over a period of 15 minutes, and then the mixture is stirred at room temperature for 20 hours. The resulting reaction solution is filtered off and the poly-o-hydroxyamide formed is precipitated with 1500 mL of a mixture of isopropanol and water. The precipitate is filtered off, washed twice with 400 mL water in each instance, and dried in a vacuum cabinet at 60° C. Capping of the end groups does not exert any influence on the polymerization, it is only carried out in order to particularly improve the thermal shape retention of the polymer during cyclization by means of cross-linking; capping is therefore not necessary.

The IR spectrum of the poly-o-hydroxyamide clearly shows only amide bands, but no ester band. The ultimate elementary analysis of the polymer yields the theoretical values, i.e., 58.24% carbon, 3.76% hydrogen, and 4.73% nitrogen; sulphur is not detectable.

The poly-o-hydroxyamide dissolves to yield a clear solution in commercial aqueous-alkaline developers which are free of metal ions. To produce films, 2.5 g of the poly-o-hydroxyamide is dissolved in 7.5 g N-methylpyrrolidone, the resultant solution is then filtered through a 1-μm filter and applied by means of a centrifugal technique to a silicon wafer. After drying on a heating plate at 115° C., a uniform, faultless polymer film having a layer thickness of 1500 nm is obtained on the wafer.

EXAMPLE 2

If a reaction mixture prepared according to Example 1 is dripped into the solution of bis-o-aminophenol described therein, at room temperature and while stirring, and treated further as in the example, a poly-o-hydroxyamide is obtained which has the same properties (elementary analysis, solubility in alkali, film formation) as the poly-o-hydroxyamide according to Example 1.

EXAMPLE 3

(Comparison Example)

The method of procedure is the same as in Example 1, but with the difference that the bis-o-aminophenol solution is dripped into the reaction mixture and brought to reaction at a temperature of 100° C. The IR spectrum of the polymer obtained shows a clear ester band, in addition to the amide bands. Furthermore, this polymer is not soluble in aqueous alkaline developers free of metal ions.

EXAMPLE 4

(Comparison Example)

The method is the same as in Example 1, except that when producing the reaction mixture, it is not heated to a temperature of 120° C., but only stirred for 60 minutes at room temperature. The IR spectrum of the product obtained shows clear bands of the starting compounds, in addition to weak amide bands. During film formation, it is found that after drying at 115° C., an uneven film with many larger defects and a thickness of only 500 to 700 nm is obtained. This product is therefore unsuitable for microelectronic applications.

Although the foregoing invention has been described in some detail by way of illustration and example for purposes of clarity of understanding, it will be evident that certain changes and modifications may be practiced within the scope of the appended claims.

What is claimed is:

1. A method for producing poly-o-hydroxyamides comprising:
   (a) heating a dicarboxylic acid to a temperature $\geq 80°$ C., together with a sulfonic acid chloride and a tertiary amine in a solvent, to form a reaction mixture, and
   (b) reacting the mixture with a solution of bis-o-aminophenol, at a temperature $<80°$ C.

2. The method according to claim 1, wherein the sulfonic acid chloride is toluene sulfonic acid chloride.

3. The method according to claim 1, wherein the heating step takes place at a temperature of $\geq 110°$ C.

4. The method according to claim 1, wherein heating step takes place for a period of 30 to 120 minutes.

5. The method according to claim 1, wherein the reacting step is carried out at a temperature of $0°$ to $30°$ C.

6. The method according to claim 1, wherein the tertiary amine is selected from the group consisting of pyridine and triethylamine.

7. The method according to claim 1, wherein the solvent is selected from the group consisting of N-methyl pyrrolidone and N,N-dimethyl acetamide.

8. The method according to claim 1, further comprising adding a dicarboxylic acid anhydride to cap amino end groups.

* * * * *